United States Patent [19]

Orban

[11] 4,249,042

[45] Feb. 3, 1981

[54] MULTIBAND CROSS-COUPLED COMPRESSOR WITH OVERSHOOT PROTECTION CIRCUIT

[75] Inventor: Robert A. Orban, Belmont, Calif.

[73] Assignee: Orban Associates, Inc., San Francisco, Calif.

[21] Appl. No.: 64,171

[22] Filed: Aug. 6, 1979

[51] Int. Cl.³ .................. H04B 1/66; H04M 1/00; H03F 1/36
[52] U.S. Cl. .................. 179/15.55 R; 179/1 VL; 330/86
[58] Field of Search .......... 179/1 VL, 1 P, 15.55 R; 330/85, 86, 144, 110, 75, 97, 51; 333/14

[56] References Cited

U.S. PATENT DOCUMENTS

| | | | |
|---|---|---|---|
| 3,538,246 | 11/1970 | Macovski et al. | 179/15.55 R |
| 3,624,306 | 11/1971 | Meyers | 179/15.55 R |
| 3,781,703 | 12/1973 | Duty | 330/86 |
| 3,789,143 | 1/1974 | Blackmer | 179/15.55 R |
| 4,034,160 | 7/1977 | Van Gerwen | 179/15.55 R |
| 4,114,115 | 9/1978 | Minnis | 330/85 |
| 4,134,074 | 1/1979 | Hershberger | 328/169 |

*Primary Examiner*—Daryl W. Cook
*Attorney, Agent, or Firm*—Blakely, Sokoloff, Taylor & Zafman

[57] ABSTRACT

A multiband compressor suitable for compressing the dynamic range of an audio signal in a broadcasting system is disclosed. The frequency band with the highest predictable energy is selected as a master band with the energy level in this band used to control the gain in the other (slave) bands. When the energy in a slave band exceeds a predetermined level, additional control of the signal level in that band occurs. The described compressor has the advantages of both the wideband compressors and multiband compressors without the disadvantages of these compressors. In addition to the compressor, a unique overshoot protection circuit is described.

16 Claims, 6 Drawing Figures

MULTIBAND CROSS-COUPLED COMPRESSOR WITH OVERSHOOT PROTECTION CIRCUIT

BACKGROUND OF THE INVENTION

1. Field of the Invention

The invention relates to the field of signal compression and overshoot protection.

2. Prior Art

Signal compression, such as audio signal compression, is frequently employed in AM and FM broadcasting and in various recording fields. For broadcasting, compression is used to reduce dynamic range and to improve the peak-to-average power ratio to obtain greater loudness within the defined limits to the channel's peak capacity. Compressors can generally be divided into two general categories, wideband systems and multiband systems.

In the wideband systems, the total energy across the frequency band is used to control the gain of the system. Thus, high energy in one frequency range causes a reduction in gain over the entire frequency band. One problem with this system is caused by the fact that in a typical audio signal the energy is seldom uniformly distributed across the frequency band. For example, in typical program material, high energies are associated with the bass range. These high energies cause audible modulation in other parts of the spectrum.

The most commonly employed commercial compressors are multiband compressors such as triband compressors, which separate the audio signal into predetermined bands. Filters with crossover slopes of 6, 12 and 18 dB per octave are common. The gain in each band is then independently limited as a function of the energy in that band. One commercial system, however, referred to as a "compliance network", limits the gain difference between adjacent bands to a maximum of 6 dB.

In multiband systems, since the bands operate independently, the instantaneous frequency response is seldom flat and, moreover, continually changing. Sometimes this results in pleasing sounds, but generally only in small, poor quality radios. In better audio equipment, the results of this varying frequency response produces unnatural sounds. Thus, to some extent the undesirable quality in the wideband compressor of audible modulation is traded for the problem of a shifting frequency response in the multiband systems.

As described above, since in multiband compressors each band operates independently, the peak level of the summed output signal is quite unpredictable. In some cases, the output of the compressor is coupled to a wideband peak limiter, thereby using gain reduction to provide peak control. However, this introduces the wideband modulation effects described above. In many prior art systems instead of using this wideband peak limiter, a clipper is used after the multiband compressor. Overdriving the clipper introduces distortion, although it does eliminate the modulation problem. If the gain into the clipper is reduced to prevent the distortion, then a poorer peak-to-average ratio and lower loudness than might otherwise be obtained results.

As will be seen, the invented compressor eliminates the problems associated with both the wideband compressors and the multiband compressors. The invented compressor is based upon the discovery that a good wideband compressor provides excellent performance for a wide variety of program material, particularly if program-controlled attack and recovery times are used. The modulation effects associated with the wideband compressor only occur if very high or very low frequencies predominate, and are accompanied by lower mid-range energy levels. In these cases, the mid-range energy is audibly modulated by the presence of the high or low frequency energies.

In the prior art, a linear low-pass filter is frequently used in conjunction with a compressor and limiter to bandlimit the signal prior to broadcasting. Numerous circuits have been described in the prior art for controlling the overshooting which results from the use of such low-pass filters. One such circuit is described in U.S. Pat. No. 4,134,074. As will be seen, the present invention provides a substantial improvement over the circuit described in this patent.

SUMMARY OF THE INVENTION

A multiband compressor for compressing an input signal is described. A first and a second filter for dividing the input signal into at least a first and a second frequency band are coupled to receive the input signal. A first gain control means coupled to the first filter controls the gain in the first band. Similarly, a second gain control means coupled to receive the output of the second filter controls the gain in the second band. Combining means are employed for combining the outputs of the first and second gain control means. A first control signal generation means provides a first control signal for controlling the gain of both the first and second gain control means. The input to this first generation means receives at least the output of the first gain control means. A second control signal generation means provides a control signal to also control the gain of the second gain control means. This second generation means receives the output of the second gain control means. The second generation means only provides control to the second gain control means when the energy in the second band exceeds a predetermined level. In this manner, the compressor provides the advantages of both the multiband and wideband compressors.

DETAILED DESCRIPTION OF THE INVENTION

A multiband cross-coupled compressor suitable for use in broadcasting systems and in other applications, and an overshoot protection circuit for use with such a compressor is disclosed. In the following description, numerous specific details are set forth, such as specific frequencies, etc., in order to provide a thorough understanding of the present invention. However, it will be obvious to one skilled in the art that the invention may be practiced without use of these specific details. In other instances, well-known circuits are shown in block diagram form in order not to obscure the present invention in unnecessary detail.

The disclosed compressor and the overshoot protection circuit may be employed in a number of applications other than broadcasting. The presently preferred embodiment of the invention is employed in a broadcasting system, and thus, the following description is oriented towards that application.

Figure 1:
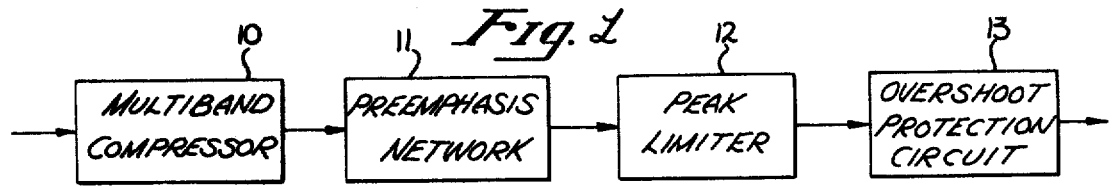
FIG. 1 is a block diagram illustrating the placement of the invented compressor and overshoot protection circuit in a broadcasting system.

In FIG. 1, the placement of the disclosed compressor and the overshoot protection circuit in a typical FM broadcasting system is illustrated. The invented compressor is shown as multi-band compressor 10 which receives an audio signal from, for example, a record player or tape deck. The multiband compressor 10 of FIG. 1, which is described in detail in conjunction with FIGS. 2, 3 and 4, decreases the dynamic range of the input audio signal to make such signal compatible with the broadcasting standards. In an FM application, the output of the compressor 10 is most typically coupled to a preemphasis network 11 to add the standard preemphasis to the audio signal. Following the preemphasis, a peak limiter is often employed to limit the peaks of the signal. The circuits presently preferred for the peak limiter are disclosed in copending applications Ser. No. 955,322, filed Oct. 27, 1978, now U.S. Pat. No. 4,208,548, and Ser. No. 9,758, filed Feb. 5, 1979, both assigned to the assignee of the present application. The output of the peak limiter 12 is coupled to an overshoot protection circuit 13. This circuit is used to eliminate overshooting which occurs at the output of limiter 12. The presently preferred embodiment of this circuit is described in conjunction with FIG. 5.

Figure 2:
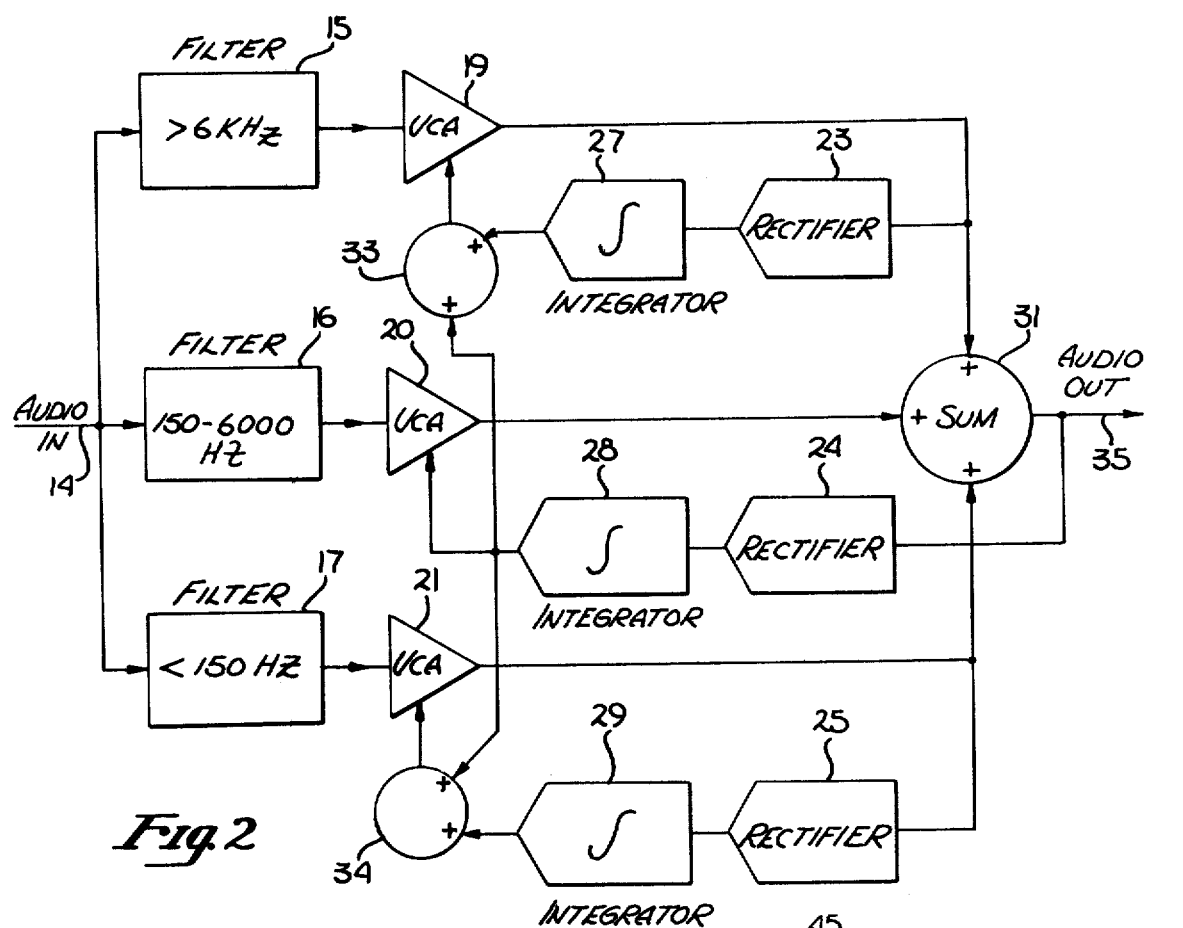
FIG. 2 is a block diagram of the presently preferred embodiment of the compressor.
Figure 6:
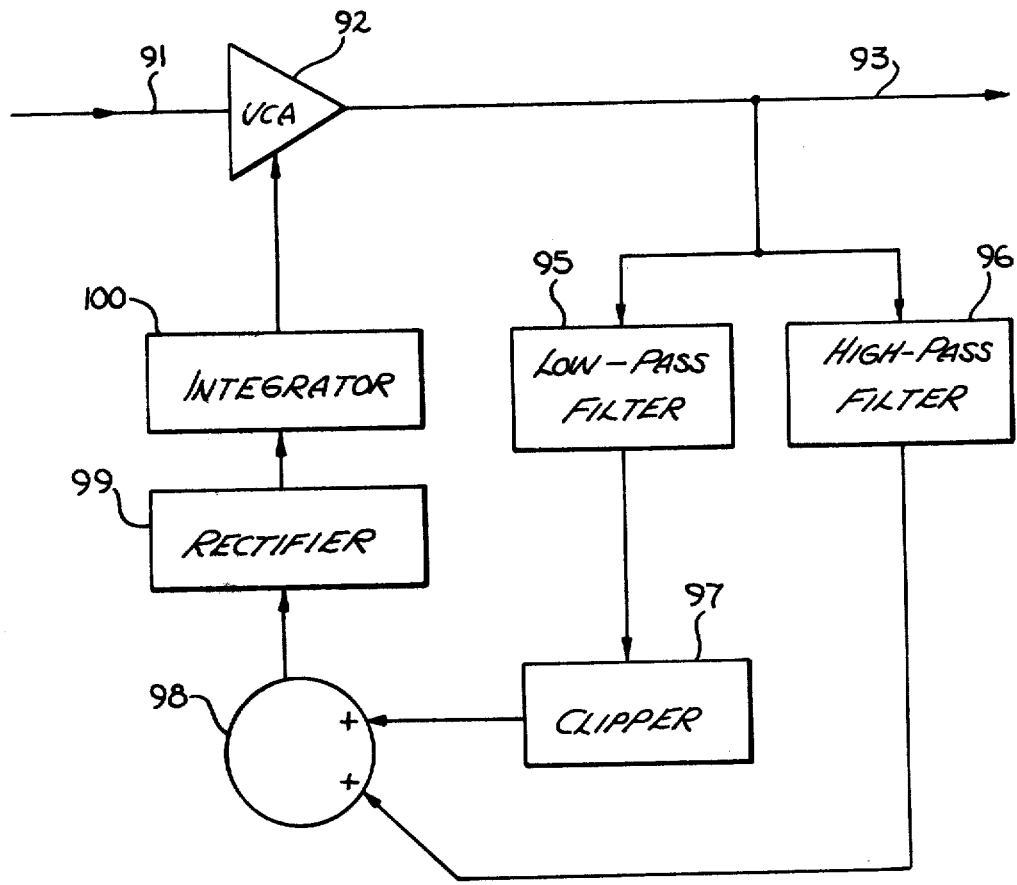
FIG. 6 is a block diagram of an alternate compressor.

Referring now to FIG. 2, in the presently preferred embodiment, the invented multiband compressor employs three bands. (It will be obvious to one skilled in the art that the described compressor may employ any number of bands greater than one, although a single band compressor (wide band) employing part of the principle of the compressor of FIG. 2 is shown in FIG. 6.) The input audio signal of line 14 is coupled to the three filters 15, 16 and 17. The midband filter 16 passes the band between 150 to 6,000 Hz. The upper frequency band passed by filter 15 are signals greater than 6,000 Hz. The low frequency band passed by filter 17 is below 150 Hz. Well-known filters may be employed such as those currently employed in multiband systems. These filters generally employ crossover slopes of 6 dB, 12 dB or 18 dB per octave. In the presently preferred embodiment, crossover slopes of 12 dB are employed in the configuration which will be described in conjunction with FIG. 4.

Figure 4:
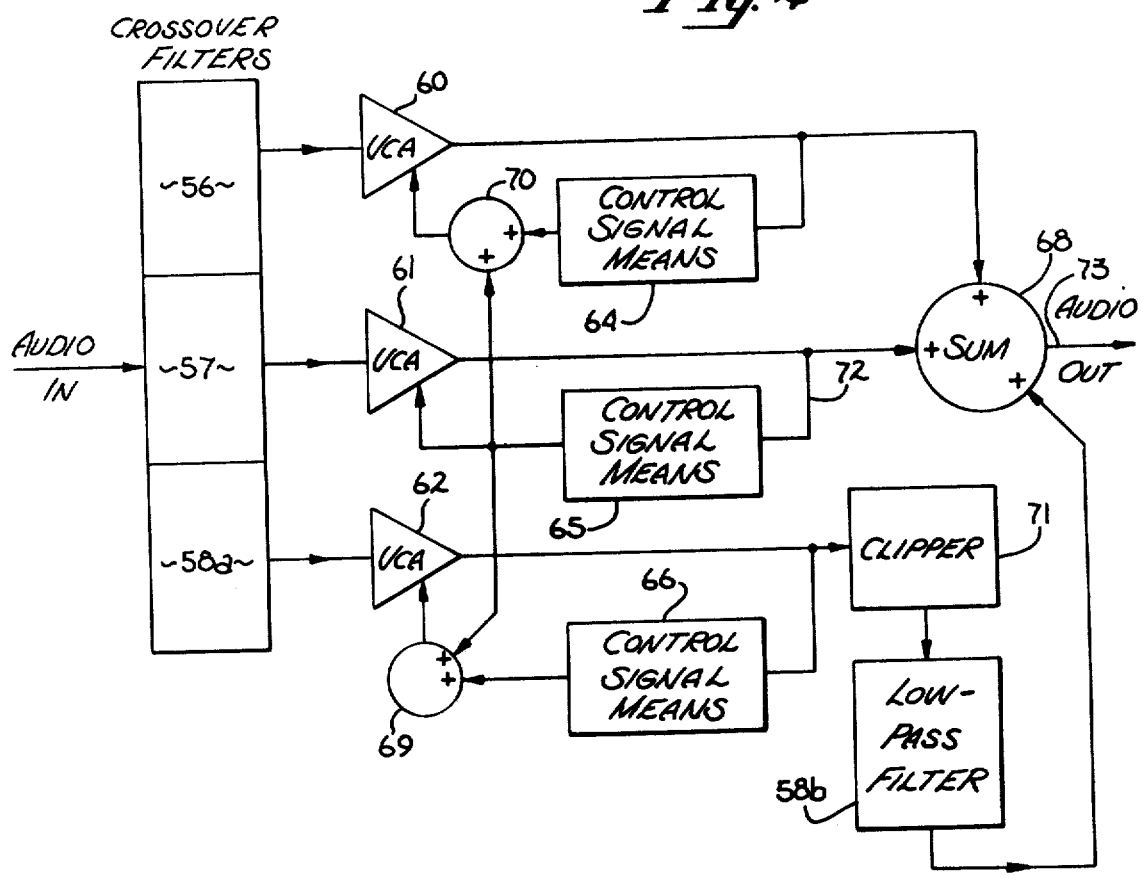
FIG. 4 is an alternate embodiment of the compressor of FIG. 2.

In the multiband compressor of FIG. 2, as well as the compressor of FIG. 4, one of the bands is designated as the "master" band and is used to provide primary control over the other "slave" bands. The band with the greatest predictable energy (150-6000 Hz) is chosen for the master band; this band also includes the frequencies to which the human ear is most sensitive (1-3 KHz).

The output of the filter 15 is coupled to a voltage controlled amplifier 19. The output of the amplifier 19 is coupled to a summer 31. Similarly, the output of the filter 16 is coupled to a voltage controlled amplifier 20 with the output of the amplifier 20 coupled to another input terminal of the summer 31. Also, the output of the filter 17 is coupled to a voltage controlled amplifier 21 and the output of this filter is coupled to the remaining input terminal of the summer 31. The summer, which may be an ordinary analog summing device, provides an output summed signal on line 35. In the presently preferred embodiment, the VCAs 19, 20 and 21 provide a gain which is proportional to the exponential of the control signal applied to these amplifiers. Such amplifiers are commercially available such as the DBX 202, manufactured by DBX Corporation.

The output of the VCA 19 is coupled through a rectifier 23 and an integrator 27 to one input terminal of a summer 3. In a similar fashion, the output of the VCA 21 is coupled through rectifier 25 and an integrator 29 to one input terminal of a summer 34. The output signal of summer 31 (line 35) is coupled through a rectifier 24 and integrator 28 and provides a control signal directly to the VCA 20. This control signal is also coupled to the other input terminals of the summers 33 and 34. The summed signal from summer 33 provides a control signal for the VCA 19, and similarly, the summed signal from the summer 34 provides a control signal for the VCA 21.

Figure 3:
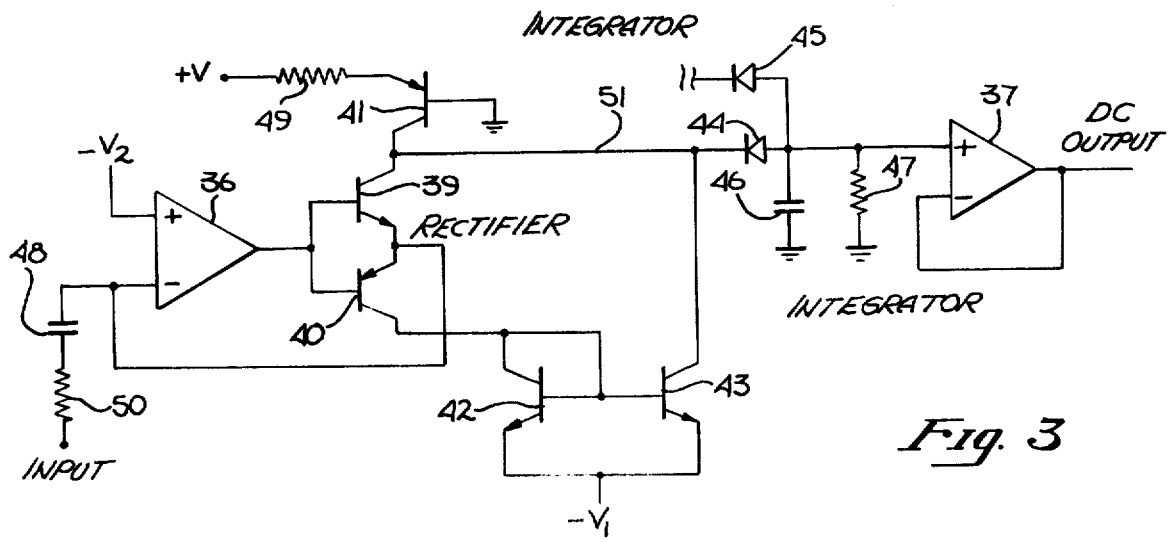
FIG. 3 is an electrical schematic of a rectifier and integrator used in the compressor of FIG. 2.

The audio signal at the output of the amplifier 19 is rectified by the rectifier 23 and then the resultant rectified signal is integrated by the integrator 27. When the audio signal at the output of amplifier 19 exceeds a predetermined threshold, a signal is applied to the summer 33 from the integrator 27 to cause gain reduction within the amplifier 19. The integrator 29 and rectifier 25 of the other slave loop may be similar in structure to the integrator 27 and rectifier 23. The presently preferred embodiments of this rectifier and integrator are shown in FIG. 3.

The rectifier 24 and integrator 28 perform a similar function to the other rectifiers and integrators to provide the main control signal for the multiband compressor. However, the integrator 28 is more like the integrators commonly used in wideband compressors/limiters and, in the presently preferred embodiment, has a program-controlled release time. A circuit for this integrator including the release time circuit is shown in copending application Ser. No. 955,322, filed Oct. 27, 1978 (FIG. 7).

In the presently preferred embodiment, the master band has an attack time of 1-3 msec. as determined by the integrator 28 and a dual-time constant release time of 50 msec./2 sec., as determined by the program-controlled release time circuit described above. If the attack times in the slave bands are long compared to the attack time in the master band, then overshooting results, causing excessive and unnatural gain reduction in the master control signal. In the presently preferred embodiment, the attack time for the high frequency band is 2 msec. and for the low frequency band 10-20 msec. The release times employed are 20 msec. for the high frequencies and 500 msec. for the low frequencies.

It is generally accepted that the attack time for the low frequencies should be slow (e.g., 20 msec.) and that overshoots should be clipped. This gives the sound from percussion instruments more solidity. As will be described in conjunction with FIG. 4, by employing a clipper in the control loop for the low frequency band, a 20 msec. attack time is used.

In general, the threshold levels for the rectifiers 23 and 25 are set below the threshold of rectifier 24. These thresholds are not critical and in practice and set "by ear" on a subjective basis.

The system of FIG. 2 provides a multiband compressor which operates as a wideband system unless the modulation effects associated with wideband systems occur. During the wideband system operation, frequency balance is preserved and thus musical integrity retained. Only when high energy occurs in either the low band or high band will frequency balances change (ordinarily in such a way that the low or high frequency energy is reduced, leaving the midband energy intact).

During a majority of the operation, the control signal at the output of the integrator 28 controls the gain in the VCAs 19, 20 and 21. If, for example, an excess amount of energy occurs in the high frequency band, an output occurs from the integrator 27 which is added to the output from the integrator 28 to provide a summed control signal for the VCA 19. Since the gain of each of the amplifiers is proportional to the exponential of the control signals, the summed signal at the output of the summer 33 affects the output of the VCA 19 in a dB/linear manner regardless of the absolute magnitude of the gain reduction occuring at any time. (The technique of employing dB/linear voltage controlled amplifiers is well-known in the prior art.) Similarly, if an excess amount of energy is present in the low frequency band, an output occurs from the integrator 29 which is summed with the output from integrator 28 to further reduce gain in the low frequency band.

In some applications, it may be desirable to have more independent operation of the bands; to accomplish this, the signal applied to the rectifier 24 may be the output of the VCA 20. When this occurs, the main control signal is determined by the mid-frequency energy rather than the summed energy at the output of the summer 31. This technique is illustrated in FIG. 4. Alternatively, the mid-band control signal means may be identical to that shown in FIG. 2 for the low frequency and high frequency bands. That is, the rectifier 24 is coupled to the output of the VCA 20 and a summer is coupled between the output of the integrator 28 and the VCA 20. Then, a master control signal is developed through the use of an additional rectifier and integrator which receives the summed signal from the output of the summer 31. The output of this additional integrator is then coupled as the master control signal to the summers 33 and 34 and the additional summer coupled to the output of the integrator 28.

An alternative way of coupling an additional rectifier into the system is to "or" its current output into each band integrator 27, 28, 29 by means of diode "or"ing gates such as diodes 44 and 45 in FIG. 3. Here, the cathodes of the three diodes corresponding to diode 45 are each connected to the output of a current-mode rectifier such as that shown in FIG. 3. The input of this rectifier is connected to line 35 of FIG. 2. Because of the "or"ing gate, a level on line 35 sufficient to cause an output from the master rectifier will cause this current output to charge the integrator 27, 28, 29 having the lowest charge (corresponding to the band having the highest gain). Thus any output from the master rectifier causes the band gains to come closer together. This variation is particularly useful when the bands are operated otherwise independently (i.e., the cross-coupling into summers 33 and 34 is omitted), because large gain variations between bands which would otherwise cause excessive level build-up at the output of summer 31 are controlled by making the system have a flatter response (i.e., by making the gains of voltage-controlled amplifiers 19, 20, 21 more nearly equal).

Referring now to FIG. 4, the system of FIG. 2 is again illustrated, however with a modification to the low frequency slave loop. Again three crossover filters are employed, shown as filters 56, 57 and 58a. These filters divide the input audio signal into the three predetermined frequency bands. In this embodiment, filters 56 and 57 provide a 12 dB per octave slope at the crossover frequencies. However, the filter 58a provides a slope of only 6 dB; another 6 dB is provided by the filter 58b. The high frequency band again includes a VCA shown as VCA 60, the output of which is coupled to a summer 68. A control signal means 64 connects the output of the VCA 60 with the summer 70. The control signal means again may be the rectifier and integrator shown in FIGS. 2 and 3. The master band includes the VCA 61, the output of which is coupled to the summer 68. The output of the VCA 61 is coupled by line 72 to a control signal means 65. The control signal means 65 may be identical to the integrator 28 and rectifier 24 of FIG. 2. The output of the control signal means 65 is coupled to control the VCA 61 and is coupled to the summers 69 and 70. The output of VCA 62 is coupled through the control signal means 66 to the summer 69. In the low frequency slave band, the output of the VCA 62 is not coupled directly to the summer 68 but rather is first coupled through a clipper 71 and the low-pass filter 58b.

The high frequency distortion introduced by the clipper 71 is greatly attenuated by the filter 58b. Moreover, the high frequency noise associated with the VCA 62 is also greatly attenuated by the filter 58b. This is particularly important since the signal-to-noise ratio of most (inexpensive) VCAs is not particularly good. By employing the clipper 71 and the filter 58b as shown in FIG. 4, the attack time in the low frequency band may be increased as far as 100 msec. Note then that the overshooting resulting from this long attack time is not summed within the summer 68, and thus does not appear in the output signal on line 73. As mentioned, these longer attack times in the low frequency band enhances the sounds of percussion instruments.

Referring now to FIG. 3, in the presently preferred embodiment of the rectifier and integrator used in FIG. 2, an input signal is applied to one input terminal of the operational amplifier 36 through a resistor 50 and capacitor 48. The output terminal of the amplifier 36 is coupled to the base terminals of transistors 39 and 40. The collector terminal of transistor 39 is coupled to the collector terminals of transistors 41 and 43. Transistor 41 is coupled to the source of positive potential through a resistor 49. The collector terminal of transistor 40 is coupled to the base terminals of transistors 42 and 43 and to the collector terminal of transistor 42. The emitter terminals of these transistors are coupled to a source of negative potential. Line 51, which is common with the collector terminals of transistors 39, 41 and 43, is also coupled to the parallel combination (through diode 44) of the capacitor 46 and resistor 47 and the positive input terminal of the operational amplifier 37. The output of this amplifier is the DC control signal coupled through the summers to the voltage controlled amplifiers of FIG. 2. In the presently preferred embodiment, $-V_1$ is equal to $-15$ volts and $-V_2$ is equal to $-12$ volts.

In operation, transistors 39 and 40 serve as a class B output stage for operational amplifier 36. Transistor 39 passes current caused by negative-going excursions of the input; current caused by positive-going excursions flows through transistor 40. The collector current of transistor 40 is inverted by transistors 42 and 43 operating as a current mirror. The output of the current mirror is summed with the output of transistor 39 to provide a full-wave rectified current-mode output on line 51.

Transistor 41 is a constant-current sink. If the output of the rectifier is smaller than the sink current, then all the rectifier output current flows through transistor 41 and this device is saturated, and no current flows through line 51 to negatively charge integrator capacitor 46 through diode 44. However, if the output of the rectifier exceeds the sink current, then capacitor 46 will be charged by the difference between the sink current and the rectifier output. Transistor 41 and current-sink determining resistor 49 thus determine a threshold. If the magnitude of the input to the rectifier is below this threshold, then no current can flow to charge the integrator. The release time of the circuit is determined by the resistance of resistor 47 since this resistor discharges the capacitor 46. A more complex program-controlled release time circuit may also be used.

In FIG. 6, an alternate compressor is illustrated which employs some of the principles of the compressors of FIGS. 2 and 4. The input audio signal is applied on line 91 to a voltage controlled amplifier 92. The output audio signal (line 93) is coupled to the input terminals of a low-pass filter 95 and a high-pass filter 96. These may be ordinary filters with slopes of 6 dB per octave and a crossover frequency of approximately 150 Hz. The output of the low-pass filter 95 is coupled to a clipper 97. The output of this clipper is summed with the output of the high-pass filter 96 by summer 98. The results of this summation are coupled to a fullwave rectifier 99 and then to an integrator 100. The rectifier and integrator may be similar to the circuit of FIG. 3. The output of the integrator 100 provides the control signal to control the gain of the voltage controlled amplifer 92.

With the wideband compressor of FIG. 6, there is no frequency distortion since the gain over the entire frequency spectrum of the audio signal remains the same. However, this system provides an advantage over prior art wideband compressors in that there is no additional gain reduction in the presence of large amounts of low frequency energy. When a substantial amount of low frequency energy occurs, this energy is clipped by clipper 97 and does not increase the gain control signal applied to the VCA 92. Thus, during these conditions, overshooting on line 93 will occur.

Figure 5:
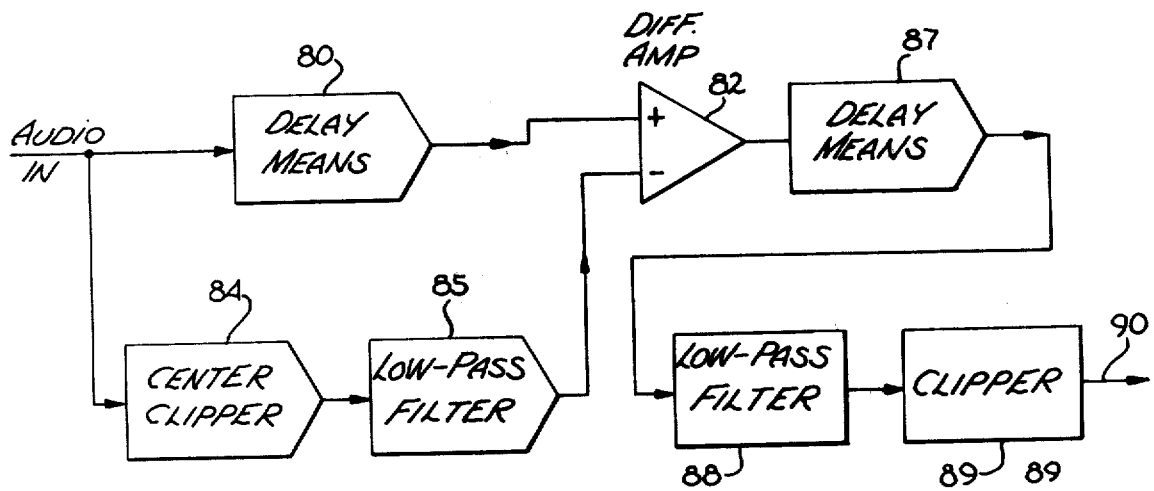
FIG. 5 is a block diagram of the presently preferred embodiment of the overshoot protection circuit.

Referring now to FIG. 5, the overshoot protection circuit shown in this figure receives a signal from the peak limiter 12 of FIG. 1. It is assumed that the output of the peak limiter is a band limited signal which includes overshoots, that is, its amplitude may exceed predetermined levels. This signal is applied to a delay means 80 and also to a center clipper 84. The output of the center clipper 84 is coupled to a low-pass filter 85, which filter has a cutoff frequency equal to the bandwidth of the system. The output of the low-pass filter 85 is subtracted from the output of the delay means 80 in the differential amplifier 82. The output of the differential amplifier 82 is delayed by the delay means 87. The output of the delay means 87 is coupled through a low-pass filter 88 to a safety clipper 89.

In the presently preferred embodiment, the delay means 80 is an ordinary third order all-pass network having a phase response approximately equal to the phase response of the filter 85. The low-pass filter 85 is a fifth order filter having a cutoff frequency of approximately 17 KHz. The low-pass filter 88 has a relatively gentle rolloff and is a third order Chebychev filter with a cutoff frequency of approximately 17 KHz. For reasons which will be explained, the filter 85 has a response which rises to +4 dB at 15 KHz. The delay means 87 is an all-pass second order network which provides delay equalization for the phase delays associated with filter 88 and also for delay means 80, particularly since delay means 80 does not have linear phase.

As mentioned, the input audio signal which is applied to the center clipper 84 and delay means 80 includes some overshooting. The center clipper isolates this overshooting. (Center clippers are generally realized as an ordinary clipper having a predetermined threshold (threshold clipper).) This results in a signal consisting of just the overshoots, that is, the center of the signal is removed. This signal is then bandlimited by filter 85 to remove the high frequency components. Within the differential amplifier 82, the overshooting of the input signal is effectively removed. The delay means 80 assures that the phase of the audio signals are approximately correct during the subtraction operation occurring within the amplifier 82.

It has been observed in practice that the low-pass filter 85 reduces the peak levels of the center clipped signal from the clipper 84, particularly where the signal from the clipper 84 contains considerable amounts of high frequency energy. This prevents proper control of the peak levels of the signal at the output of the differential amplifier 82. To partially compensate for this, as mentioned, the filter 85 includes a response which rises to +4 dB at 15 KHz. This permits less gain to be employed in the subtracting process than would otherwise be required.

After the differencing within amplifier 82, some small amount of high frequency energy may be present and thus the filter 88 is employed. Since delay means 87 constrains filter 88 to have constant delay within its passband, and since the energy of out-of-band components applied to the input of filter 88 is very low, no significant overshooting is caused by this filter. Finally, a safety clipper 89 is employed as is usual in the prior art. The final output (audio) signal for an FM modulator or the like is thus provided on line 90.

The system of FIG. 5 has a substantial advantage over prior art overshoot protection circuits which employ a center clipper. In U.S. Pat. No. 4,134,074, one such circuit is illustrated. The circuit includes a first low-pass filter to bandlimit the audio signal. This filter has a generally steep rolloff characteristic which results in a considerable amount of overshooting. A center clipper is then employed which isolates this overshooting and then the overshooting is subtracted from the audio signal to compensate for a second low-pass filter with a steep rolloff. However, the clipper introduces frequency components beyond the desired bandwidth. To correct this, the second low-pass filter is necessary. Since the overshoots inherent in this second low-pass filter are known (from the first low-pass filter) and are subtracted from the main signal, the output of the second low-pass filter are substantially peak limited. Because of the approximations in the process, a safety clipper and a single order low-pass filter are also employed.

The major limitation of this system is that the second low-pass filter, while removing out-of-band components from the output of the center clipper, also removes higher-order harmonics necessary to accurately cancel overshoots. To approximately compensate for this, it is necessary to raise the gain at the output of the center clipper. This gain increase also increases the level of any low frequency intermodulation distortion introduced by the center clipper. Because the main audio also passes through the second low-pass filter, its response must be flat.

In contrast, the circuit of FIG. 5 filters only the output of center clipper 84 through filter 85. Because filter 85 does not pass the main audio (which passes instead through delay 80), the frequency response of filter 85 may be shaped to increase its gain at high frequencies, yet its lower low frequency gain does not emphasize low frequency intermodulation distortion as in the other system.

Thus, a multiband compressor has been described which has the advantages of both the multiband compressors and the wideband compressors. A unique overshoot protection circuit has also been described for preventing overshooting of the compressed signal.

I claim:

1. A multiband compressor for compressing an input signal comprising:
   a first and a second filter for dividing said input signal into at least a first and a second frequency band, said filters coupled to receive said input signal;
   first gain control means for controlling the gain of said first band, coupled to said first filter;
   second gain control means for controlling the gain of said second band, coupled to said second filter;
   combining means for combining the outputs of said first and second gain control means, coupled to the outputs of said first and second gain control means;
   first control signal generation means for providing a first control signal for controlling the gains of said first and second gain control means, said first generation means coupled to receive said output of at least said first gain control means and coupled to said first and second gain control means;
   second control signal generation means for providing a second control signal to control said gain of said second gain control means, said second generation means coupled to receive said output of said second gain control means and coupled to provide control to said second gain control means when said output of said second gain control means exceeds a predetermined level,
   whereby said compressor provides both multiband and wideband compression.

2. The compressor defined by claim 1 wherein said first band is the midband range for an audio signal.

3. The compressor defined by claim 1 wherein said first control signal generation means receives the output of said combining means.

4. The compressor defined by claim 1 wherein each of said first and second control signal generation means comprises a rectifier and an integrator.

5. The compressor defined by claim 4 wherein said first and second control signals are summed before being coupled to said second gain control means.

6. The compressor defined by claim 5 wherein said first and second gain control means are each voltage controlled amplifiers which have dB linear response to said control signals.

7. The compressor defined by claim 1 wherein said second band is a low frequency audio band and wherein a clipper and a low-pass filter are coupled between said second gain control means and said combining means.

8. A multiband compressor for compressing an input audio signal comprising:
   a first, second and third filter for separating said input audio signal into a high band, mid band and low band, respectively, said filters coupled to receive said input signal;
   first gain control means for controlling the gain of said high band, coupled to said first filter;
   second gain control means for controlling the gain of said mid band, coupled to said second filter;
   third gain control means for controlling the gain of said low band, coupled to said third filter;
   combining means for combining the outputs of said first, second and third gain control means, coupled to the outputs of said first, second and third gain control means;
   first gain control signal generation means for providing a first control signal to control said gain of said first gain control means, said first generation means coupled to receive said output from said first gain control means and coupled to provide control to said first gain control means when said output of said first gain control means exceeds a predetermined level;
   second control signal generation means for providing a second control signal for controlling the gains of said first, second and third gain control means, said second generation means coupled to receive said output of at least said second gain control means and coupled to said first, second and third gain control means;
   third control signal generation means for providing a third control signal to control said gain of said third gain control means, said third generation means coupled to receive said output of said third gain control means and coupled to provide control to said third gain control means when said output of said third gain control means exceeds a predetermined level;
   whereby said compressor provides both multiband and wideband compression.

9. The compressor defined by claim 8 wherein each of said gain control means comprises a rectifier and an integrator.

10. The compressor defined by claim 9 wherein each of said control signal generation means receives a signal through a diode network from said combining means.

11. The compressor defined by claim 9 wherein a clipper and a first low-pass filter are coupled between said third gain control means and said combining means.

12. The compressor defined by claim 11 wherein said third filter is a second low-pass filter and wherein said first and second low-pass filters each have asymptotic slopes of approximately 6 dB per octave.

13. The compressor defined by claim 12 wherein said first and second filters have slopes of approximately 12 dB per octave at the crossover frequency between said mid band and high band.

14. An audio compressor comprising:
   a gain control means for controlling the gain of an audio signal;
   a low-pass filter coupled to the output of said gain control means;
   a second filter coupled to the output of said gain control means;
   a clipper coupled to the output of said low-pass filter;

combining means for combining signals coupled to the output of said clipper and to the output of said second filter;

control signal generation means for generating a control signal for said gain control means, said generation means coupled to said combining means and to said gain control means;

whereby wideband compression is provided without substantial gain reduction in the presence of high energy in the low frequency band.

15. The compressor defined by claim 14 wherein said second filter comprises a high-pass filter.

16. The compressor defined by claim 15 wherein said control signal generation means comprises a rectifier and an integrator.

* * * * *